United States Patent
Banin et al.

(10) Patent No.: US 8,391,803 B2
(45) Date of Patent: Mar. 5, 2013

(54) DEVICE, SYSTEM AND METHOD OF CONFIGURABLE FREQUENCY SIGNAL GENERATION

(75) Inventors: Rotem Banin, Zur Moshe (IL); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 12/977,410

(22) Filed: Dec. 23, 2010

(65) Prior Publication Data

US 2012/0161830 A1    Jun. 28, 2012

(51) Int. Cl.
*H04B 1/40*    (2006.01)
*H04K 3/00*    (2006.01)

(52) U.S. Cl. ............................................ 455/76; 331/2

(58) Field of Classification Search ............ 455/76, 455/255–260; 331/2, 42–43; 375/376
See application file for complete search history.

(56) References Cited

U.S. PATENT DOCUMENTS

| | | | |
|---|---|---|---|
| 4,797,637 A * | 1/1989 | Kegasa et al. ................... | 331/4 |
| 7,869,781 B2 * | 1/2011 | Li et al. ......................... | 455/230 |
| 2007/0140645 A1 | 6/2007 | Marsili et al. | |
| 2007/0149160 A1 | 6/2007 | Tseng et al. | |
| 2010/0207693 A1 | 8/2010 | Fagg | |

OTHER PUBLICATIONS

IEEE Standard for Information technology—Telecommunications and information exchange between systems—Local and metropolitan area networks—Specific requirements Part 11: Wireless LAN Medium Access Control (MAC) and Physical Layer (PHY) Specifications IEEE Std 802.11™-2007 (Revision of IEEE Std 802.11-1999 ).
U.S. Appl. No. 12/977,382, filed Dec. 23, 2010.
International Search Report and Written Opinion Received for PCT Patent Application No. PCT/US2011/064705, Mailed on Jul. 30, 2012, 9 pages.

* cited by examiner

*Primary Examiner* — Lee Nguyen
(74) *Attorney, Agent, or Firm* — Shichrur & Co.

(57) ABSTRACT

Some demonstrative embodiments include devices, systems and/or methods of configurable frequency signal generation. For example, a device may include at least one configurable local-oscillator (LO) generator to receive an input frequency signal and one or more configurable input values and to convert the input frequency signal into at least one output frequency signal according to a configurable conversion ratio, which is based on the configurable input values.

17 Claims, 6 Drawing Sheets

DEVICE, SYSTEM AND METHOD OF CONFIGURABLE FREQUENCY SIGNAL GENERATION

BACKGROUND

Various devices may include one or more frequency generation circuits.

A frequency generation circuit may include a Voltage Controlled Oscillator (VCO) controlled by a Phase-locked-loop (PLL), to generate a source frequency, and a Local Oscillator (LO) generator to convert the source frequency into a frequency signal according to a preset conversion ratio.

Some devices may include a plurality of frequency generation circuits to generate a respective plurality of frequency signals.

For example, a wireless communication device may include a plurality of frequency generation circuits to generate a plurality of carrier signal frequencies corresponding to a plurality of wireless communication frequency channels.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
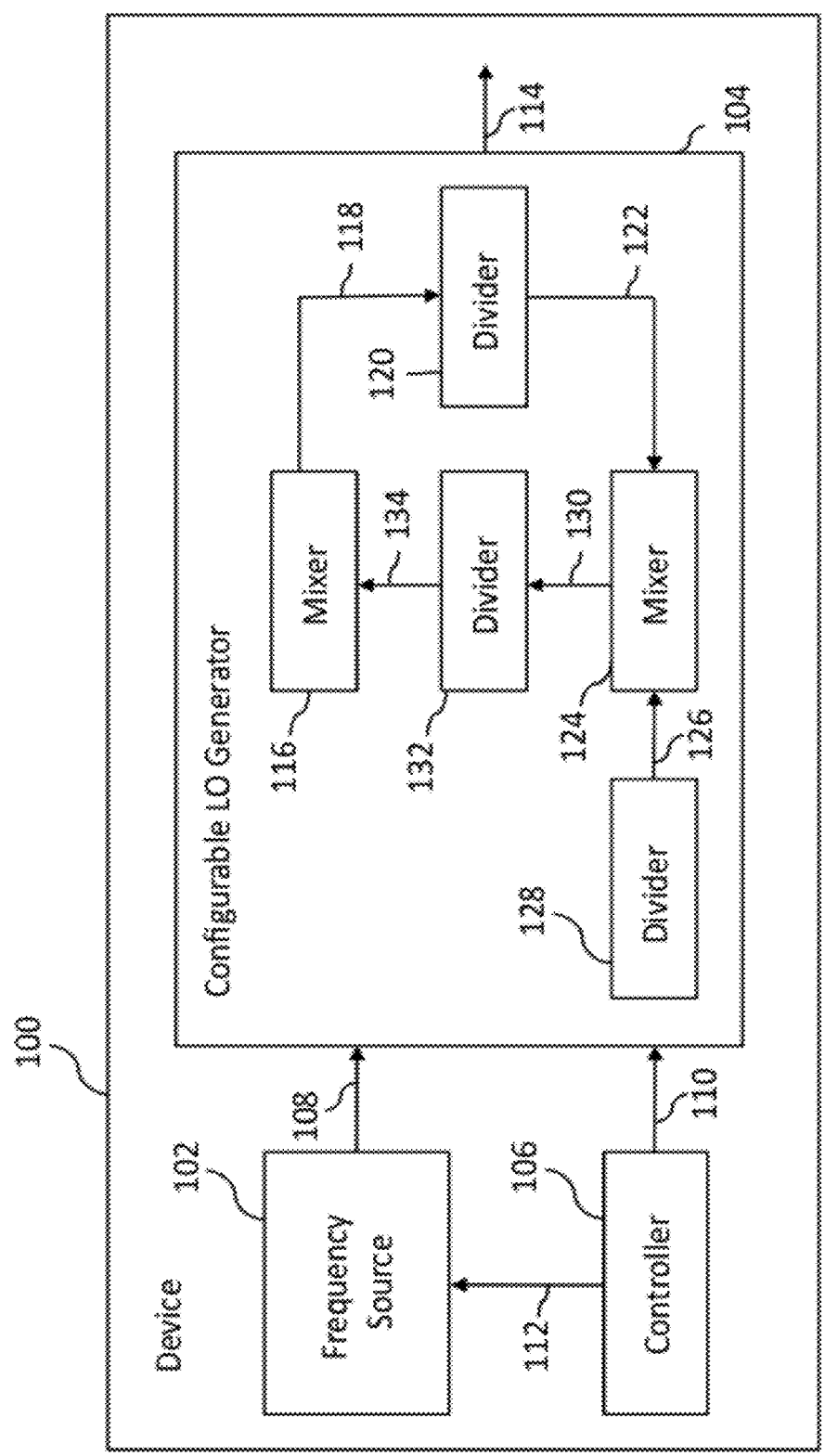
FIG. 1 is a schematic block diagram illustration of a device, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein include, for example, "multiple" or "two or more". For example, "a plurality of items" includes two or more items.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a wired or wireless network, a wireless area network, a Wireless Video Area Network (WVAN), a Local Area Network (LAN), a Wireless LAN (WLAN), a Wireless Metropolitan Area Network (WMAN) communication system, a Personal Area Network (PAN), a Wireless PAN (WPAN), devices and/or networks operating in accordance with existing IEEE 802.11 (*IEEE 802.11-2007: Standard for Information technology—Telecommunications and information exchange between systems—Local and metropolitan area networks—Specific requirements, Part 11: Wireless LAN Medium Access Control (MAC) and Physical Layer (PHY) Specifications—June 2007*), 802.11n ("*IEEE 802.11n—2009—Amendment 5: Enhancements for Higher Throughput. IEEE-SA. 29 Oct. 2009*"), 802.11ac ("*Very High Throughput <6 Ghz*"), 802.11 task group ad (TGad) ("*Very High Throughput 60 GHz*") standards ("the 802.11 standards"), 802.16 (*IEEE-Std 802.16, 2004 Edition, Air Interface for Fixed Broadband Wireless Access Systems*), 802.16d, 802.16e (*IEEE-Std 802.16e, 2005 Edition, Physical and Medium Access Control Layers for Combined Fixed and Mobile Operation in Licensed Bands*), 802.16f, 802.16m standards ("the 802.16 standards") and/or future versions and/or derivatives thereof, devices and/or networks operating in accordance with existing Wireless-Gigabit-Alliance (WGA) and/or WirelessHD™ specifications and/or future versions and/or derivatives thereof, devices and/or networks operating in accordance with existing cellular specifications and/or protocols, e.g., 3rd Generation Partnership Project (3GPP), 3GPP Long Term Evolution (LTE), and/or future versions and/or derivatives thereof, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a device having one or more internal antennas and/or external antennas, Digital Video Broadcast (DVB) devices or systems, multi-standard radio devices or systems, a wired or wireless handheld device (e.g., Black-Berry, Palm Treo), a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

The term "wireless device" as used herein includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may be used to provide a wireless service.

Reference is now made to FIG. 1, which schematically illustrates a block diagram of a device 100 in accordance with some demonstrative embodiments.

In some demonstrative embodiments, device 100 may include or may be included as part of, for example, may include a computing device, a communication device, a wireless communication device, an electronic device, a circuit, and/or any other suitable device. For example, device 100 may include or may be included as part of a PC, a desktop computer, a mobile computer, a laptop computer, a notebook computer, a tablet computer, a server computer, a handheld computer, a handheld device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a cellular telephone, a handset, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a STB, a BD player, a BD recorder, a DVD player, a HD DVD player, a DVD recorder, a HD DVD recorder, a PVR, a broadcast HD receiver, a video source, an audio source, a video sink, an audio sink, a stereo tuner, a broadcast radio receiver, a flat panel display, a PMP, a DVC, a digital audio player, a speaker, an audio receiver, a gaming device, an audio amplifier, a data source, a data sink, a DSC, a media player, a Smartphone, a television, a music player, an AP, a base station, or the like.

In some demonstrative embodiments, device 100 may include at least one configurable local-oscillator (LO) generator 104 to generate at least one configurable output frequency signal 114, e.g., as described in detail below.

In some demonstrative embodiments, LO generator 104 may receive an input frequency signal 108 and one or more configurable input values 110. Lo generator 104 may convert input frequency signal 108 into output frequency signal 114 according to a configurable conversion ratio, which is based on configurable input values 110, e.g., as describe din detail below.

In some demonstrative embodiments, device 100 may include a frequency source 102 to generate signal 108. Frequency source 102 may include any suitable frequency source, for example, a frequency source including a suitable Voltage Controlled Oscillator (VCO) controlled by a suitable Phase-locked-loop (PLL).

In some demonstrative embodiments, device 100 may include any suitable controller to control LO generator 104 and/or frequency source 102 to generate output frequency signal 114 having a suitable frequency. For example, controller 106 may provide LO generator 104 with configurable input values 110 and/or controller 106 may provide frequency source 102 with a suitable control signal 112 resulting in output frequency signal 114 having a suitable frequency, e.g., as described below.

In some demonstrative embodiments, one or more configurable input values 110 may include a plurality of configurable input values, and the configurable conversion ratio applied by LO generator 104 may include a predefined combination of the plurality of configurable input values.

In some demonstrative embodiments, an input value of configurable input values 110 may have a value selected from a predefined set of input values, e.g., as described below. In one example, each of configurable input values 110 may have a value selected from a predefined set of input values, and output frequency 114 may include a frequency selected from a predefined set of frequencies, e.g., as described below.

In some demonstrative embodiments, configurable input values 110 may include three or more input values, e.g., three input values, denoted A, B and N. In other embodiments, configurable input values 110 may include any other suitable number of input values.

In some demonstrative embodiments, one or more of configurable input values 110 may include input values ("coarse conversion input values") to coarsely define a range of frequency values. For example, the coarse conversion input values may have a value selected from a predefined set of values including a relatively small number of values.

In some demonstrative embodiments, the input values A and B may include coarse conversion input values. For example, the input value A and/or the input value B may be selected from a predefined set of input values including a relatively small number of values, for example, less than ten values, e.g., three values. In one example, the input value A and/or the input value B may be selected from a set of input values including the values 2, 4 and 6, e.g., as described below. In other embodiments, the input values A and B may be selected from any other set of values.

In some demonstrative embodiments, one or more of configurable input values 110 may include input values ("fine conversion input values") to define a frequency within the coarse range of frequencies. For example, the fine conversion input values may have a value selected from a predefined set of values including a relatively large number of values, e.g., to allow defining a relatively large number of frequencies within the coarse range.

In some demonstrative embodiments, the input value N may include a fine conversion input value. For example, the input value N may be selected from a predefined set of input values including a relatively large number of values, for example, more than ten values, for example, more then one hundred values, e.g., 255 values. In one example, the input value N may be selected from a set of input values including the values between 1 and 255, e.g., as described below. In other embodiments, the input value N may be selected from any other set of values.

In some demonstrative embodiments, configurable LO generator 104 may include a feedback/feed-forward combination of frequency mixers and programmable dividers to convert input frequency signal 108 into output frequency signal 114 according to configurable input values 110, e.g., as described below.

In some demonstrative embodiments, configurable LO generator 104 may include a first frequency mixer 116, a second frequency mixer 124, a first divider 120, a second divider 132 connected in a feedback/feed-forward loop and/or a third divider 128, e.g., as described below.

In some demonstrative embodiments, mixer 116 and/or mixer 124 may include any suitable frequency mixer, for example, any suitable Single-Side-Band (SSB) frequency mixer and/or any suitable Image Reject Mixer (IRM). An IRM may include a mixer capable of receiving two quadrature signals having different frequencies, and combining the two quadrature signals to generate an output signal having a frequency, which is equal a sum of the two quadrature signals or a difference between the two quadrature signals. The quadrature signals may include any suitable signals separated, in phase, e.g., by ninety degrees.

In some demonstrative embodiments, divider 120, divider 132 and/or divider 128 may include any suitable programmable frequency divider capable of receiving an input frequency signal, and applying a programmable or configurable conversion ratio to the input frequency signal to generate an output signal, such that a ratio between the frequency of the output signal and the frequency of the input signal is equal to the configurable conversion ratio.

In some demonstrative embodiments, divider 120 may generate a first divider output 122 by dividing a first mixer output 118 of mixer 116 by a first configurable input value of configurable input values 110.

In some demonstrative embodiments, divider 120 may be configured to generate divider output 122 by dividing output 118 by a value corresponding to the value A, e.g., the value A, or a value based on the value A, e.g., 2A, and the like.

In some demonstrative embodiments, divider 132 may generate a second divider output 134 by dividing a second mixer output 130 of mixer 124 by a second configurable input value of configurable input values 110.

In some demonstrative embodiments, divider 132 may be configured to generate divider output 134 by dividing mixer output 130 by value corresponding to the value B, e.g., the value B, or a value based on the value B, e.g., 2B, and the like.

In some demonstrative embodiments, mixer 116 may generate mixer output 118 based on divider output 134, and/or mixer 124 may generate mixer output 130 based on divider output 122, e.g., as described below.

In some demonstrative embodiments, LO generator may provide mixer output 118 as output frequency signal 114.

In some demonstrative embodiments, mixer 116 may generate output frequency signal 114 based on a combination of input frequency signal 108 and divider output 134, e.g., as described below with reference to FIGS. 2 and/or 4.

In some demonstrative embodiments, mixer 124 may generate mixer output 130 based on a combination of divider output 122 and a mixer input signal 126.

In some demonstrative embodiments, mixer input signal 126 may include an output generated by divider 128, e.g., as described below.

In some demonstrative embodiments, divider 128 may generate signal 126 based on a third configurable input value of configurable input values 110.

In some demonstrative embodiments, divider 128 may generate signal 126 based on the value N.

In some demonstrative embodiments, divider 128 may generate signal 126 by dividing the input frequency signal 108 by the third configurable input value, for example, by a value corresponding to the value N, e.g., the value N, or a value based on the value N, e.g., 2N, and the like, as described below with reference to FIG. 2.

In some demonstrative embodiments, divider 128 may generate signal 126 by dividing the output frequency signal 114 by the third configurable input value, for example, a value corresponding to the value N, e.g., the value N, or a value based on the value N, e.g., 2N, and the like, as described below with reference to FIG. 4.

Figure 2:
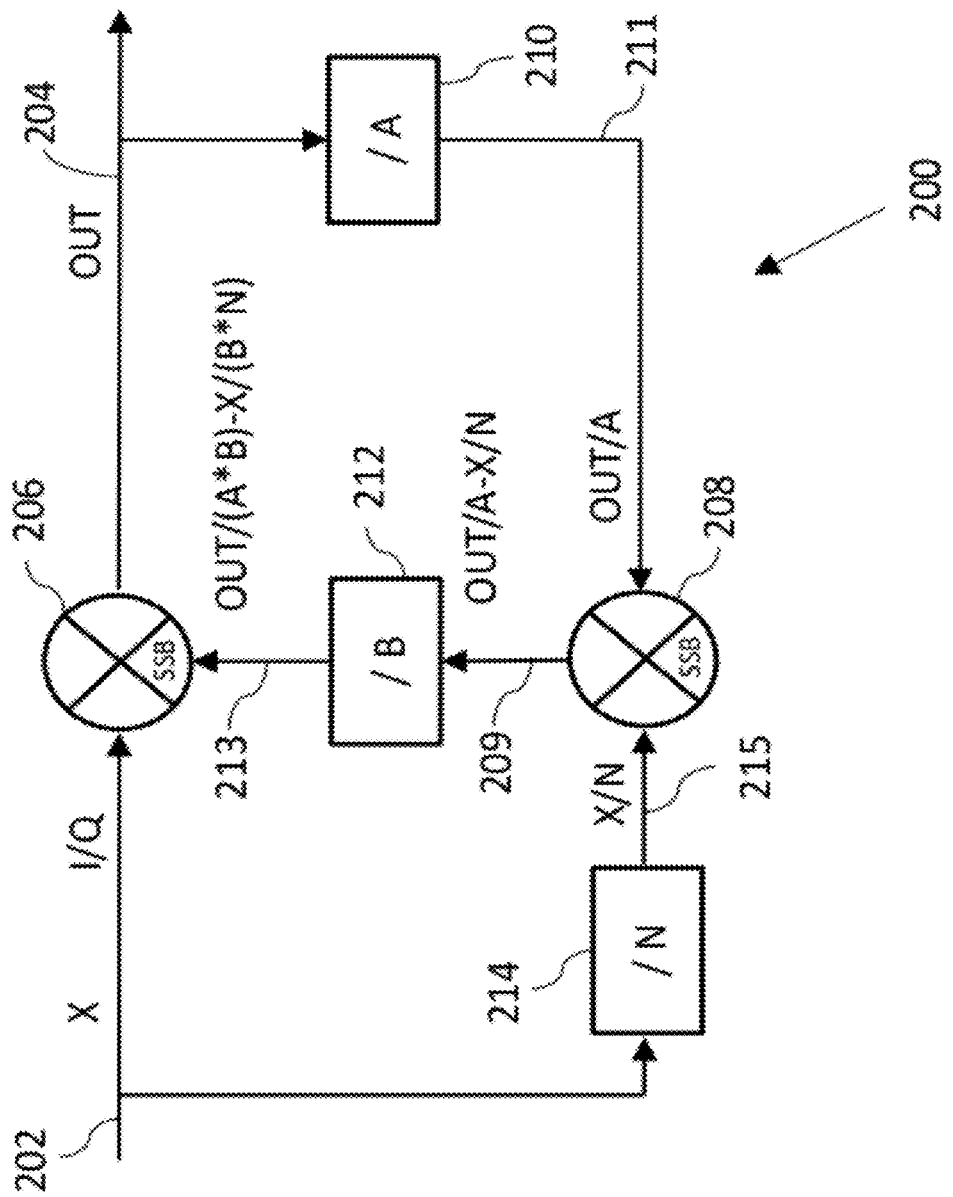
FIG. 2 is a schematic illustration of a configurable Local-Oscillator (LO) generator, in accordance with some demonstrative embodiments.

Reference is now made to FIG. 2, which schematically illustrates a configurable LO generator 200, in accordance with some demonstrative embodiments. In some demonstrative embodiments, LO generator 200 may perform the functionality of configurable LO generator 104 (FIG. 1).

In some demonstrative embodiments, configurable LO generator 200 may be configured to receive a plurality of input values, e.g., input values 110 (FIG. 1), including the input values A, B and N.

In some demonstrative embodiments, configurable LO generator 200 may convert an input frequency 202, denoted X, e.g., input frequency 108 (FIG. 1), into an output frequency 204, denoted OUT, e.g., output frequency 114 (FIG. 1), according to a conversion ratio, which corresponds to a combination of the input values A, B and N.

In some demonstrative embodiments, configurable LO generator 200 may include a first frequency mixer 206, a second frequency mixer 208, a first programmable divider 210, a second programmable divider 212, and a third programmable divider 214. Mixers 206 and 308 may include any suitable mixers, for example, any suitable SSB frequency mixers and/or IRMs. Dividers 210, 212 and 214 may include any suitable programmable dividers.

In some demonstrative embodiments, divider 210 may be configured to generate a first divider output 211 by dividing output frequency 204 by the value A.

In some demonstrative embodiments, divider 212 may be configured to generate a second divider output 213 by dividing an output 209 of mixer 208 by the value B.

In some demonstrative embodiments, mixer 206 may be configured to generate output 204 based on divider output 213 and frequency input 202. For example, output 204 may correspond to a difference between output 213 and input 202.

In some demonstrative embodiments, divider 214 may be configured to generate a third divider output 215 by dividing input 202 by the value N.

In some demonstrative embodiments, mixer 208 may be configured to generate output 209 based on divider output 211 and divider output 215. For example, output 209 may correspond to a difference between output 211 and output 215.

In some demonstrative embodiments, configurable LO generator 200 may convert the input frequency X into the output frequency OUT, for example, according to the following configurable conversion ratio:

$$\text{OUT} = \left[ \frac{(A*B)*(B*N \pm 1)}{(A*B \pm 1)*(B*N)} \right] * X \quad (1)$$

In some demonstrative embodiments, an input value of input values A, B and N may be set, e.g., by controller 106 (FIG. 1), to a selected value of a predefined set of values. For example, the input value A may be set to a selected value of the set 2, 4 and 6; the input value B may be set to a selected value of the set 2, 4 and 6; and/or the input value N may be set to a selected value of the set of values between 12 and 1020. In other embodiments, the input values A, B and/or N may include any other suitable value.

In some demonstrative embodiments, the values of A, B and N may be set, e.g., by controller 106 (FIG. 1), in order to achieve a suitable desired frequency at output 204. Accordingly, controller 106 (FIG. 1) may controllably configure the values of A, B and N, e.g., in order to controllably modify the output frequency 204.

Figure 3A:
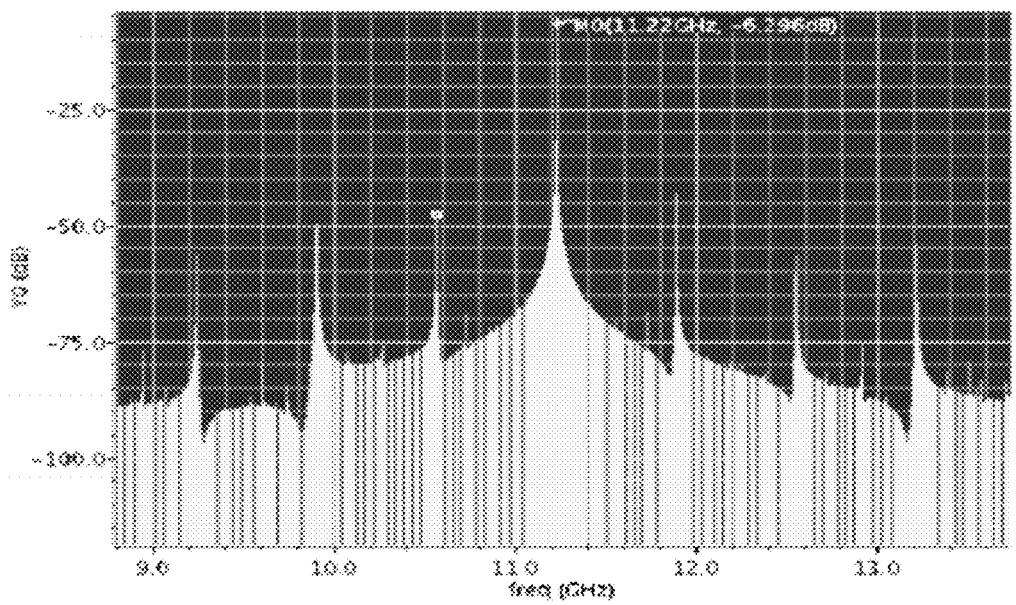
FIGS. 3A and 3B are illustrations of graphs depicting simulation results of first and second, respective, output frequencies of the configurable LO generator of FIG. 2, in accordance with some demonstrative embodiments.

In one example, the input frequency X may be set to 10.56 GHz, e.g., by controlling frequency source 102 (FIG. 1), and the values A, B and N may be configured to 4, 4 and 64, respectively. As shown in FIG. 3A, these values of A, B and N may be implemented for generating the output frequency OUT of 11.22 GHz, which may be divided into first and second frequencies of 5.61 GHz, e.g., for IQ modulation.

Figure 3B:
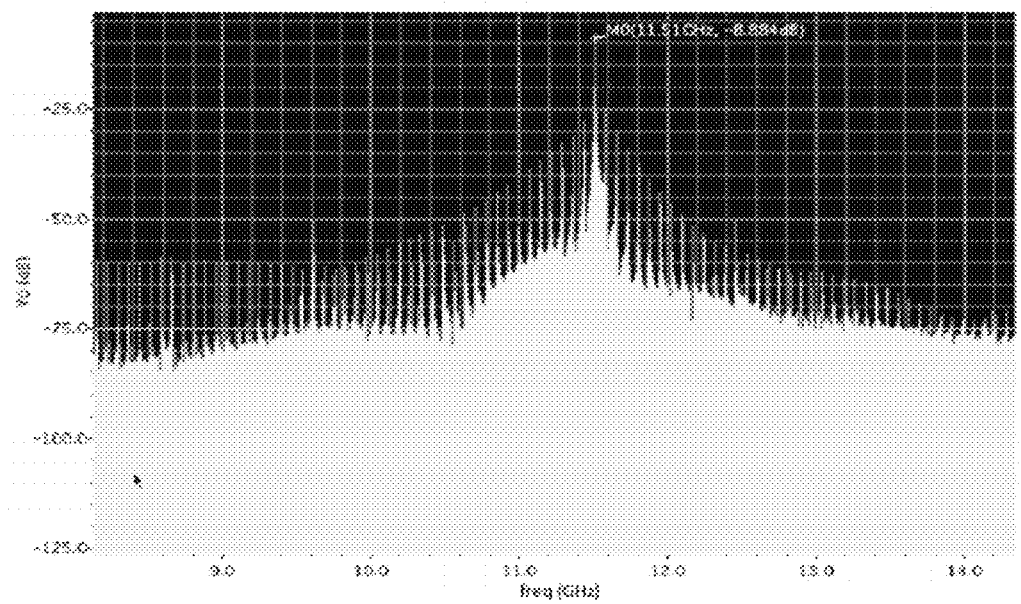

In another example, the input frequency X may be set to 10.56 GHz, e.g., by controlling frequency source 102 (FIG. 1), the values A, B and N may be configured to 6, 2 and 576, respectively. As shown in FIG. 3B, these values of A, B and N may be implemented for generating the output frequency OUT of 11.51 GHz, which may be divided into first and second frequencies of 5.755 GHz, e.g., for IQ modulation.

In other embodiments, configurable LO generator 200 may include any other suitable configuration of mixers and/or dividers. In one example, LO generator 200 may be modified by switching between dividers 210 and 214, e.g., such that the inputs to mixer 208 include the input frequency X divided by the value A, and the output frequency 204 divided by the value N.

Figure 4:
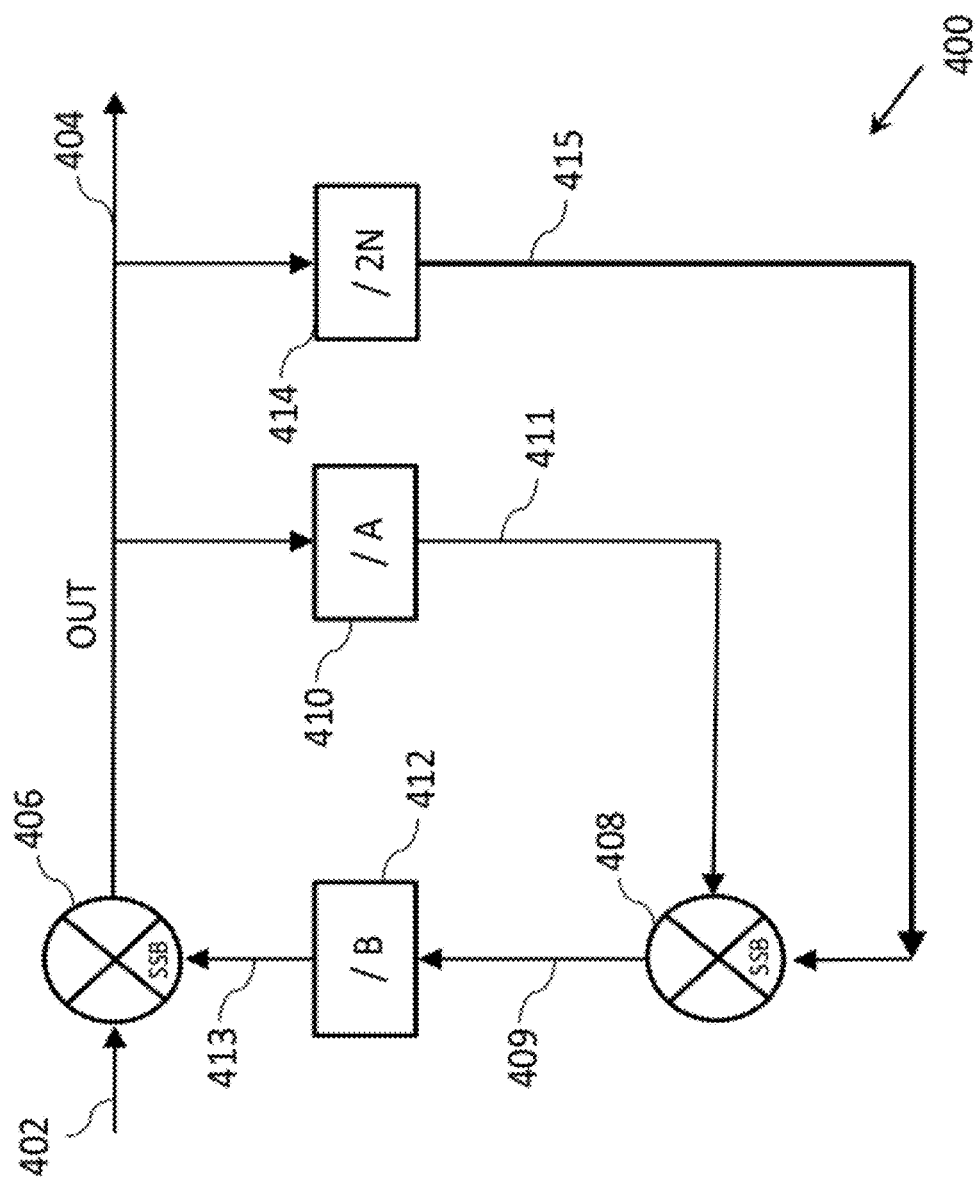
FIG. 4 is a schematic illustration of a configurable LO generator, in accordance with some demonstrative embodiments.

Reference is now made to FIG. 4, which schematically illustrates a configurable LO generator 400, in accordance with some demonstrative embodiments. In some demonstrative embodiments, LO generator 400 may perform the functionality of configurable LO generator 104 (FIG. 1).

In some demonstrative embodiments, configurable LO generator 400 may be configured to receive a plurality of input values, e.g., input values 110 (FIG. 1), including the input values A, B and N.

In some demonstrative embodiments, configurable LO generator 400 may convert an input frequency 402, denoted X, e.g., input frequency 108 (FIG. 1), into an output frequency 404, denoted OUT, e.g., output frequency 114 (FIG. 1), according to a conversion ratio, which corresponds to a combination of the input values A, B and N.

In some demonstrative embodiments, configurable LO generator 400 may include a first frequency mixer 406, a second frequency mixer 408, a first programmable divider 410, a second programmable divider 412, and a third programmable divider 414. Mixers 406 and 408 may include any suitable mixers, for example, any suitable SSB frequency mixers and/or IRMs. Dividers 410, 412 and 414 may include any suitable programmable dividers.

In some demonstrative embodiments, divider 410 may be configured to generate a first divider output 411 by dividing output frequency 404 by the value A.

In some demonstrative embodiments, divider 412 may be configured to generate a second divider output 413 by dividing an output 409 of mixer 408 by the value B.

In some demonstrative embodiments, mixer 406 may be configured to generate output 404 based on divider output 413 and frequency input 402. For example, output 404 may correspond to a difference between output 413 and input 402.

In some demonstrative embodiments, divider 414 may be configured to generate a third divider output 415 by dividing output 404 by a value corresponding to the value N, e.g., by 2N.

In some demonstrative embodiments, mixer 408 may be configured to generate output 409 based on divider output 411 and divider output 415. For example, output 409 may correspond to a difference between output 411 and output 415.

In some demonstrative embodiments, configurable LO generator 400 may convert the input frequency X into the output frequency OUT, for example, according to the following configurable conversion ratio:

$$\text{OUT} = \left[ \frac{2*A*B*N}{(2*A*B*N) \mp (2*N \pm 1)} \right] * X \quad (2)$$

In some demonstrative embodiments, an input value of input values A, B and N may be set, e.g., by controller 106 (FIG. 1), to a selected value of a predefined set of values. For example, the input value A may be set to a selected value of the set 2, 4 and 6; the input value B may be set to a selected value of the set 2, 4 and 6; and/or the input value N may be set to a selected value of the set of values between 1 and 255. In other embodiments, the input values A, B and/or N may include any other suitable value.

In some demonstrative embodiments, the values of A, B and N may be set, e.g., by controller 106 (FIG. 1), in order to achieve a suitable desired frequency at output 404. Accordingly, controller 106 (FIG. 1) may controllably configure the values of A, B and N, e.g., in order to controllably modify the output frequency 404.

In other embodiments, configurable LO generator 400 may include any other suitable configuration of mixers and/or dividers.

Referring back to FIG. 1, in some demonstrative embodiments, device 100 may include a plurality of configurable LO generators 104 to receive input frequency signal 108 from common frequency source 102 and to generate a respective plurality of different output frequency signals based on input frequency signal 108.

In some demonstrative embodiments, device 100 may include, or may be part of, a wireless communication device including a plurality of radio-frequency (RF) paths to simultaneously communicate over the plurality of output frequency signals, respectively, e.g., as described in detail below.

Figure 5:
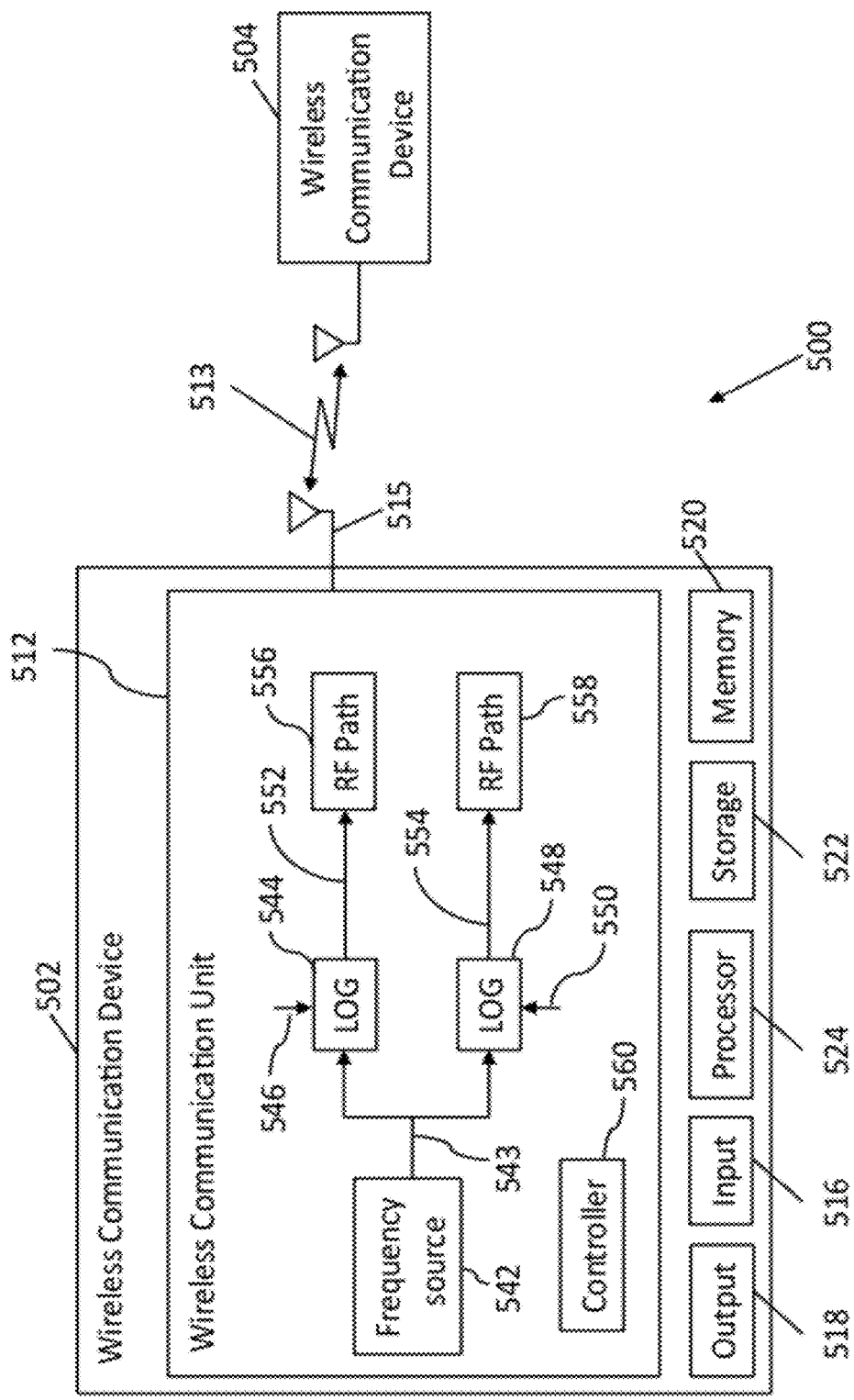
FIG. 5 is a schematic illustration of a system, in accordance with some demonstrative embodiments.

Reference is now made to FIG. 5, which schematically illustrates a system 500, in accordance with some demonstrative embodiments.

As shown in FIG. 5, in some demonstrative embodiments, system 500 may include one or more wireless communication devices, e.g., wireless communication devices 502 and/or 504, capable of communicating content, data, information and/or signals over at least one wireless communication link 513, e.g., as described in detail below. One or more elements of system 500 may optionally be capable of communicating over any suitable wired communication links.

In some demonstrative embodiments, wireless communication devices 502 and/or 504 may include or perform the functionality of device 100 (FIG. 1).

In some demonstrative embodiments, device 502 may include a wireless communication unit 512 to transmit a wireless transmission to device 504 and/or receive a wireless transmission from device 504, over at lest one wireless communication link 513, e.g., via one or more antennas 515. Types of antennas that may be used for antennas 515 may include but are not limited to internal antenna, dipole antenna, omni-directional antenna, a monopole antenna, an end fed antenna, a circularly polarized antenna, a micro-strip antenna, a diversity antenna and the like.

In some demonstrative embodiments, wireless communication link 513 may have a bandwidth of at least 160 Mega-Hertz (MHz), e.g., as described below. In other embodiments, wireless communication link 513 may have any other suitable bandwidth.

In some demonstrative embodiments, wireless communication devices 502 and/or 504 may also include, for example, one or more of a processor 524, an input unit 516, an output unit 518, a memory unit 520, and a storage unit 522. Wireless communication devices 502 and/or 504 may optionally include other suitable hardware components and/or software components. In some demonstrative embodiments, some or all of the components of each of wireless communication devices 502 and/or 504 may be enclosed in a common housing or packaging, and may be interconnected or operably associated using one or more wired or wireless links In other embodiments, components of each of wireless communication devices 102 and/or 106 may be distributed among multiple or separate devices.

Processor 524 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 524 executes instructions, for example, of an Operating System (OS) of wireless communication devices 502 and/or 506 and/or of one or more suitable applications.

Input unit 516 includes, for example, a keyboard, a keypad, a mouse, a touch-pad, a track-ball, a stylus, a microphone, or other suitable pointing device or input device. Output unit 118 includes, for example, a monitor, a screen, a flat panel display, a Cathode Ray Tube (CRT) display unit, a Liquid Crystal Display (LCD) display unit, a plasma display unit, one or more audio speakers or earphones, or other suitable output devices.

Memory unit 520 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 522 includes, for example, a hard disk drive, a floppy disk drive, a Compact Disk (CD) drive, a CD-ROM drive, a DVD drive, or other suitable removable or non-removable storage units. Memory unit 520 and/or storage unit 522, for example, may store data processed by wireless communication device 502 and/or 504.

In some demonstrative embodiments, wireless communication unit 512 may transmit and/or receive wireless communication signals over a plurality of different wireless communication frequency channels, for example, simultaneously, e.g., as described in detail below.

Some embodiments are described below with reference to communicating over a wireless communication link, e.g., wireless communication link 513, including a plurality of non-contiguous channels. However, other embodiments may be utilized for communicating over any other suitable plurality of wireless communication frequency channels, e.g., simultaneously.

In one example, link 513 may include a Frequency-division duplexing (FDD) link. For example, device 502 may receive a first transmission over a first wireless communication frequency channel of link 513, and transmit, e.g., simultaneously, a second transmission over a second wireless communication frequency channel of link 513.

In another example, device 502 may communicate with devices of a first wireless communication system, e.g., a WLAN, over a first wireless communication frequency channel; and, e.g., simultaneously, with devices of a second wireless communication system, e.g., a WPAN, over a second wireless communication frequency channel.

In yet another example, link 513 may include any suitable duplex communication link.

In some demonstrative embodiments, link 513 may include one or more communication channels within a five Gigahertz frequency band.

In one example, an increased throughput, e.g., above 1 Gigabit-per-second (Gbps) per wireless communication client, may be required in order, for example, to satisfy a demand for transferring increased amounts of data within wireless communication networks, such as, for example, wireless local area networks (WLAN) and/or wireless personal area networks (WPAN). The increased throughput may be achieved, for example, by using a communication link having a wide bandwidth. For example, a bandwidth of more than 80 Mega-Hertz (MHz) may be required in order to provide a throughput greater than 1 Gbps, e.g., in a network operating over a frequency band of 5 Giga-Hertz (GHz) in accordance with the IEEE 802.11 standards. A plurality of wireless communication frequency channels may be required in order to achieve the high bandwidth. For example, more than four 20 MHz channels may be required, e.g., according to the IEEE 802.11 standards, in order to achiever a bandwidth of more than 80 MHz.

In some demonstrative embodiments, wireless communication link 513 may include a plurality of non-contiguous wireless communication channels.

The phrase "non-contiguous channels", as used herein, may refer to two or more wireless communication channels, which are not adjacent, neighboring, and/or bordering one another. In one example, first and second wireless communication channels may be non-contiguous if, for example, the first wireless communication channel is separated from the second wireless communication channel, e.g., by one or more other wireless communication channels, sub-channels, frequency bands, and the like.

In some demonstrative embodiments, at least one channel of the plurality of non-contiguous channels has a bandwidth at least 20 MHz, e.g., at least 80 MHz. In other embodiments, the non-contiguous wireless communication channels may have any other suitable bandwidth.

In one embodiment, wireless communication link 513 may include at least two non-contiguous channels, each having a bandwidth of 80 MHz, or any other bandwidth. In other embodiments, wireless communication link 513 may include any other suitable number of wireless communication channels, which may have any other suitable bandwidth.

Some demonstrative embodiments are described herein with reference to a wireless communication link, e.g., wireless communication link 513, including two non-contiguous wireless communication channels having equal bandwidth, e.g., two 80 MHz channels. However, in other embodiments, the wireless communication link may include two or more non-contiguous wireless communication channels of different bandwidths. In one example, the wireless communication link may include at least one channel having a bandwidth of 80 MHz and at least one channel having a bandwidth different from 80 MHz, e.g., 20 MHz, 40 MHz, 120 MHz, 160 MHz and the like. In other embodiments, wireless communication link 113 may include any other suitable combination of two or more non-contiguous channels having any suitable bandwidth.

In some embodiments, wireless communication link 513 may include one or more additional channels, which may or may not be contiguous to one or more of non-contiguous channels. For example, wireless communication link 513 may include first and second non-contiguous 80 MHz channels, and a third channel, e.g., an 80 MHz channel, which may be contiguous to one of the first and second channels.

In some demonstrative embodiments, at least one channel of the plurality of non-contiguous channels may include two or more contiguous channels or sub-channels. For example, the 80 Mhz cannel may include four contiguous 20 MHz channels, e.g., in accordance with the 802.11 standards and/or any other suitable standard and/or protocol.

In some demonstrative embodiments, wireless communication unit 512 may simultaneously communicate over a plurality of different configurable carrier signal frequencies, for example, a plurality of different configurable carrier signal frequencies, which are configured based on a common source frequency signal, e.g., as described below.

In some demonstrative embodiments, wireless communication unit 512 may include a frequency source 542 to generate a source frequency signal 543. Frequency source 542 may include any suitable frequency source, e.g., frequency source 102 (FIG. 1).

In some demonstrative embodiments, wireless communication unit 512 may include a plurality of LO generators to generate a respective plurality of different carrier signal frequencies based on source frequency signal 543. For example, wireless communication unit 512 may include a first LO generator 544 to generate a first carrier signal frequency 552 based on source frequency signal 543; and a second LO generator 548 to generate a second carrier signal frequency 554, e.g., different from carrier signal frequency 552, based on source frequency signal 543.

In some demonstrative embodiments, wireless communication unit 512 may include a plurality of radio-frequency (RF) paths to simultaneously communicate over the plurality of carrier signal frequencies, respectively, e.g., as described below.

In some demonstrative embodiments, wireless communication unit 512 may include a first RF path 556 and a second RF path 558 to simultaneously transmit and/or receive wireless communication signals over carrier signal frequencies 552 and 554, respectively. RF paths 556 and 558 may include any suitable transmit (Tx) paths, e.g., including one or more suitable Tx chains, and/or receive (Rx) paths, e.g., including any suitable Rx chains 544.

In one example, carrier signal frequencies 552 and 554 may include carrier signal frequencies corresponding to two respective non-contiguous channels of link 513, e.g., as described above. Accordingly, RF paths 556 and 558 may include two Tx chains to transmit a wireless transmission over the two non-contiguous channels of link 513. In another example, RF paths 556 and 558 may include two Rx chains to receive a wireless transmission over the two non-contiguous channels of link 513.

In another example, wireless communication unit 512 may be configured to generate and/or communicate over more than two carrier signal frequencies. For example, wireless communication unit 512 may be configured to generate four carrier signal frequencies and wireless communication unit 512 may include four RF paths, e.g., including two Rx chains and two Tx chains, to communicate over the four carrier signal frequencies, respectively.

In yet another example, RF path 556 may include a Tx chain to transmit a transmission over carrier signal frequency 552, and RF path 558 may include a Rx chain to receive a transmission over carrier signal frequency 554.

In yet another example, RF path 556 may include a first Tx chain to transmit a transmission over carrier signal frequency 552 of a first wireless communication system, e.g., a WLAN, and RF path 558 may include a second Tx chain to transmit a transmission over carrier signal frequency 554 of a second wireless communication system, e.g., a WPAN.

In some demonstrative embodiments, RF paths 556 and/or 558 may include any suitable Physical-layer (PHY) chains and/or components; any suitable Radio-Frequency (RF) chains and/or components; and/or any other suitable elements.

In some demonstrative embodiments, wireless communication unit 512 may include a controller 560, e.g., a media-access-controller (MAC) or any other suitable controller, to control the communication via RF paths 556 and/or 558, e.g., as described below.

In some demonstrative embodiments, wireless communication unit 512 may be configured to generate a plurality of configurable carrier signal frequencies, e.g., including configurable carrier signal frequencies 552 and/or 554.

In some demonstrative embodiments, the plurality of LO generators may include a plurality of LO generators to generate a respective plurality of configurable carrier signal frequencies. For example, LO generators 544 and/or 548 may include configurable LO generator 104 (FIG. 1).

In some demonstrative embodiments, controller 560 may controllably set carrier signal frequencies 552 and/or 554, for example, by controlling frequency source 542 and/or LO generators 544 and/or 548. For example, controller 560 may include or perform the functionality of controller 106 (FIG. 1) for controlling frequency source 542 and/or LO generators 544 and/or 548.

In some demonstrative embodiments, LO generators 544 and/or 548 may generate configurable carrier signal frequencies 552 and 554 by applying first and second respective configurable conversion ratios to source frequency signal 543, e.g., as described above. For example, LO generators 544 and/or 548 may include LO generator 104 (FIG. 1), LO generator 200 (FIG. 2) and/or LO generator 400 (FIG. 4).

In some demonstrative embodiments, wireless communication unit 512 may have reduced power consumption, reduced die area, reduced production cost, reduced design complexity and/or increased immunity to oscillator pulling compared, for example, to a transmitter utilizing a plurality of frequency sources for generating a respective plurality of carrier signal frequencies.

Figure 6:
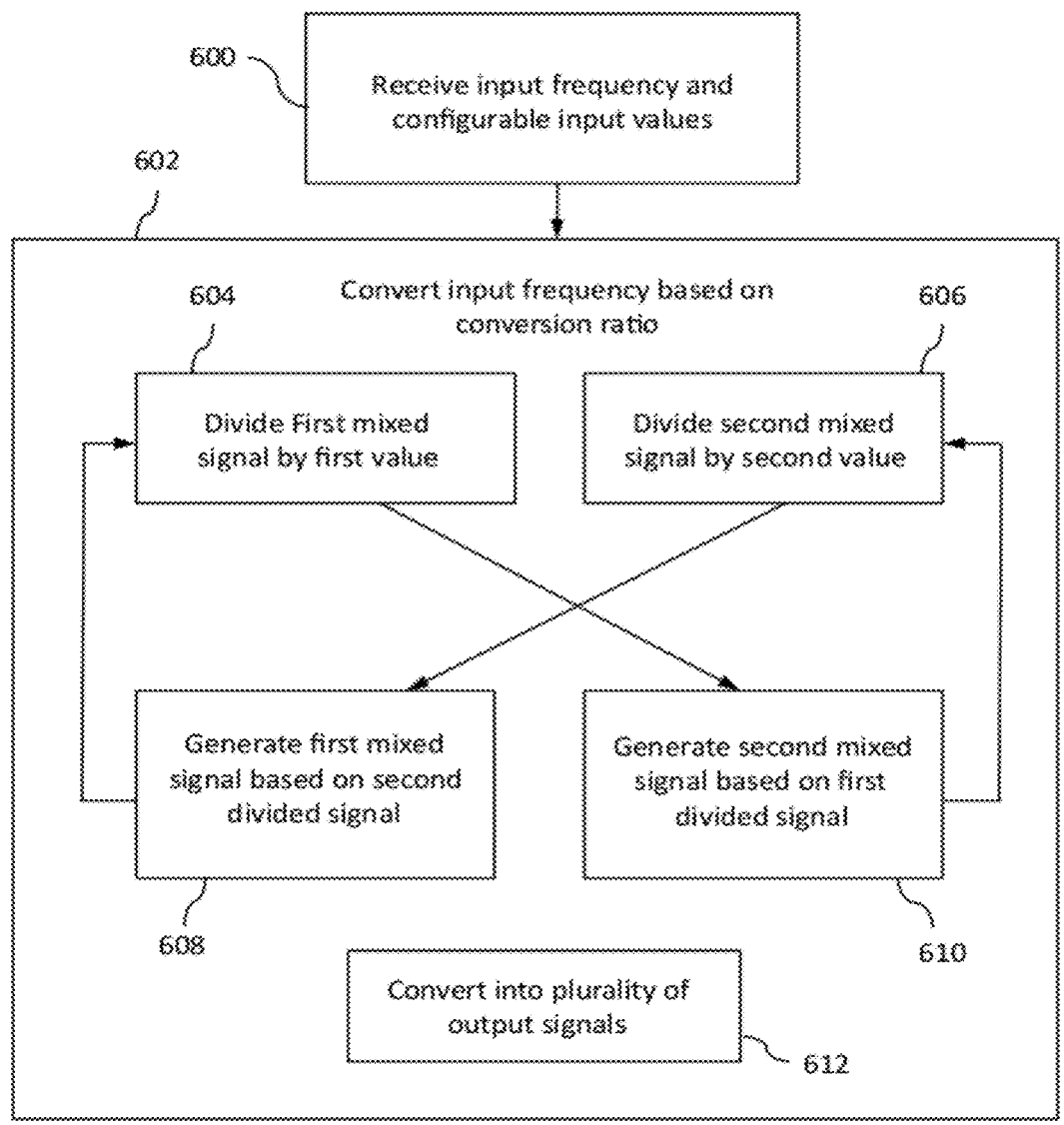
FIG. 6 is a schematic flow-chart illustration of a method of wireless communication over a plurality of wireless communication frequency channels, in accordance with some demonstrative embodiments.

Reference is made to FIG. 6, which schematically illustrates a method of configurable frequency signal generation, in accordance with some demonstrative embodiments. In some embodiments, one or more operations of the method of FIG. 6 may be performed by one or more elements of a system, e.g., system 500 (FIG. 1), and/or a device, e.g., device 100 (FIG. 1) and/or device 502 (FIG. 1).

As indicated at block 600, the method may include receiving an input frequency signal and one or more configurable input values. For example, configurable LO generator 104 (FIG. 1) may receive input frequency signal 108 (FIG. 1) from frequency source 102 (FIG. 1), and input values 110 (FIG. 1) from controller 106 (FIG. 1).

As indicated at block 602, the method may include converting the input frequency signal into at least one output frequency signal according to a configurable conversion ratio, which is based on the configurable input values. For example, configurable LO generator 104 (FIG. 1) may convert input frequency signal 108 (FIG. 1) into output frequency signal 114 (FIG. 1) according to a configurable conversion ratio, which is based on input values 110 (FIG. 1), e.g., as described above.

In some demonstrative embodiments, the one or more configurable input values may include a plurality of configurable input values, e.g., the values A, B and/or N, and the configurable conversion ratio includes a predefined combination of the plurality of configurable input values.

As indicated at block 604, converting the input frequency signal may include dividing a first mixed frequency signal by a first configurable input value of the plurality of configurable input values to generate a first divided frequency signal. For example, divider 120 (FIG. 1) may divide mixer output 118 (FIG. 1) by the value A, e.g., as described above.

As indicated at block 606, converting the input frequency signal may include dividing a second mixed frequency signal by a second configurable input value of the plurality of configurable input values to generate a second divided frequency signal. For example, divider 132 (FIG. 1) may divide mixer output 130 (FIG. 1) by the value B, e.g., as described above.

As indicated at block 608, converting the input frequency signal may include generating the first mixed frequency signal based on the second divided frequency signal. For example, mixer 116 (FIG. 1) may generate mixer output 118 (FIG. 1) based on divider output 134 (FIG. 1), e.g., as described above.

As indicated at block 610, converting the input frequency signal may include generating the second mixed frequency signal based on the first divided frequency signal. For example, mixer 124 (FIG. 1) may generate mixer output 130 (FIG. 1) based on divider output 122 (FIG. 1), e.g., as described above.

In some demonstrative embodiments, the first mixed frequency signal may include the output frequency signal. For example output frequency 114 (FIG. 1) may include mixer output 118 (FIG. 1), e.g., as described above.

As indicated at block 612, converting the input frequency signal may include converting the input frequency signal into a plurality of different output frequency signals according to a respective plurality of configurable conversion ratios. For example, LO generators 544 and 548 (FIG. 5) may convert common source frequency 543 (FIG. 5) into signals 552 and 554 (FIG. 5), e.g., as described above.

Some embodiments may be implemented using an article including one or more types of computer-readable storage media capable of storing data, including volatile memory, non-volatile memory, removable or non-removable memory, erasable or non-erasable memory, writeable or re-writeable memory, and the like. For example, the machine-readable storage medium may include, random-access memory (RAM), dynamic RAM (DRAM), Double-Data-Rate DRAM (DDR-DRAM), synchronous DRAM (SDRAM), static RAM (SRAM), read-only memory (ROM), programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some embodiments, the article may include logic in the form of instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some embodiments, the logic may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A device comprising:
   at least one configurable local-oscillator (LO) generator to receive an input frequency signal and a plurality of configurable input values and to convert the input frequency signal into at least one output frequency signal according to a configurable conversion ratio, which is based on a combination of the configurable input values, wherein the configurable LO generator comprises:
   first and second frequency mixers;
   a first programmable divider to generate a first divider output by dividing a first mixer output of the first mixer by a first configurable input value of said plurality of configurable input values; and
   a second programmable divider to generate a second divider output by dividing a second mixer output of the second mixer by a second configurable input value of said plurality of configurable input values,
wherein the first frequency mixer is to generate the first mixer output based on the second divider output, and the second frequency mixer is to generate the second mixer output based on the first divider output.

2. The device of claim 1, wherein the first mixer output comprises the output frequency signal.

3. The device of claim 2, wherein the first frequency mixer is to generate the output frequency signal based on a combination of the input frequency signal and the second divider output,
and wherein the second frequency mixer is to generate the second mixer output based on a combination of the first divider output and a second mixer input signal.

4. The device of claim 3 comprising a third programmable divider to generate the second mixer input signal based on a third configurable input value of said plurality of configurable input values.

5. The device of claim 4, wherein the third programmable divider is to generate the second mixer input signal by dividing the input frequency signal by the third configurable input value.

6. The device of claim 4, wherein the third programmable divider is to generate the second mixer input signal by dividing the output frequency signal by the third configurable input value.

7. The device of claim 1, wherein said at least one configurable LO generator comprises a plurality of configurable LO generators to receive the input frequency signal from a common frequency source and to generate a respective plurality of different output frequency signals based on said input frequency signal.

8. The device of claim 7 comprising a wireless communication device including a plurality of radio-frequency (RF) paths to simultaneously communicate over said plurality of output frequency signals, respectively.

9. The device of claim 1, wherein an input value of said configurable input values has a value selected from a predefined set of input values, and wherein the output frequency signal includes a frequency selected from a predefined set of frequencies.

10. A wireless communication system comprising:
a wireless communication device comprising:
at least one antenna;
a wireless communication unit to communicate over at least one carrier signal frequency via said antenna, the wireless communication unit including at least one configurable local-oscillator (LO) generator to receive an input frequency signal and a plurality of configurable input values and to convert the input frequency signal into the at least one carrier signal frequency according to a configurable conversion ratio, which is based on a combination of the configurable input values, wherein the configurable LO generator comprises:
first and second frequency mixers;
a first programmable divider to generate a first divider output by dividing a first mixer output of the first mixer by a first configurable input value of said plurality of configurable input values; and
a second programmable divider to generate a second divider output by dividing a second mixer output of the second mixer by a second configurable input value of said plurality of configurable input values,
wherein the first frequency mixer is to generate the first mixer output based on the second divider output, and the second frequency mixer is to generate the second mixer output based on the first divider output.

11. The system of claim 10, wherein the first mixer output comprises the carrier signal frequency,
wherein the first frequency mixer is to generate the carrier signal frequency based on a combination of the input frequency signal and the second divider output,
and wherein the second frequency mixer is to generate the second mixer output based on a combination of the first divider output and a second mixer input signal.

12. The system of claim 11 comprising a third programmable divider to generate the second mixer input signal based on a third configurable input value of said plurality of configurable input values.

13. The system of claim 10, wherein said at least one carrier signal frequency includes a plurality of carrier signal frequencies, and wherein said at least one configurable LO generator comprises a plurality of configurable LO generators to receive the input frequency signal from a common frequency source and to generate the plurality of carrier signal frequencies based on said input frequency signal.

14. The system of claim 10, wherein an input value of said configurable input values has a value selected from a predefined set of input values, and wherein the carrier signal frequency includes a frequency selected from a predefined set of frequencies.

15. A method comprising:
receiving an input frequency signal and plurality configurable input values; and
converting the input frequency signal into at least one output frequency signal according to a configurable conversion ratio, which is based on a combination of the configurable input values, wherein converting the input frequency signal comprises:
dividing a first mixed frequency signal by a first configurable input value of said plurality of configurable input values to generate a first divided frequency signal;
dividing a second mixed frequency signal by a second configurable input value of said plurality of configurable input values to generate a second divided frequency signal;
generating the first mixed frequency signal based on the second divided frequency signal; and
generating the second mixed frequency signal based on the first divided frequency signal.

16. The method of claim 15, wherein the output frequency signal comprises the first mixed frequency signal.

17. The method of claim 15, wherein converting the input frequency signal comprises converting the input frequency signal into a plurality of different output frequency signals according to a respective plurality of configurable conversion ratios.

* * * * *